United States Patent [19]
Griffin et al.

[11] Patent Number: 5,015,322
[45] Date of Patent: May 14, 1991

[54] TANK ARRANGEMENT PARTICULARLY DESIGNED FOR CHEMICAL MILLING OPERATIONS

[75] Inventors: Bruce M. Griffin, St. Charles; Robert G. Werkema, St. Louis, both of Mo.; Elbert D. Watt, Godfrey, Ill.

[73] Assignee: McDonnell Douglas Corporation, Long Beach, Calif.

[21] Appl. No.: 483,788

[22] Filed: Feb. 23, 1990

[51] Int. Cl.[5] .......................... B44C 1/22; C23F 1/00; C03C 15/00; C03C 25/06
[52] U.S. Cl. .................................... 156/345; 156/639
[58] Field of Search ............... 156/345, 639, 656, 642, 156/638; 134/34, 89, 91

[56] References Cited

U.S. PATENT DOCUMENTS

| | | | |
|---|---|---|---|
| 3,072,133 | 1/1963 | Martz | 156/345 X |
| 3,999,564 | 12/1976 | Pesek | 156/345 X |
| 4,137,118 | 1/1979 | Brimm | 156/639 X |
| 4,302,273 | 11/1981 | Howard | 156/345 |
| 4,440,594 | 4/1984 | Stearns | 156/345 X |
| 4,784,169 | 11/1988 | Striedieck | 156/642 X |

Primary Examiner—William A. Powell
Attorney, Agent, or Firm—Max Geldin

[57] ABSTRACT

A tank arrangement particularly adapted for processing parts in chemical milling operations, especially for circulation of water-base maskant fluid. The system includes a tank containing up-flow and down-flow draft tubes, each containing a low speed, high volumetric displacement impeller which minimizes shear stresses imparted on the maskant liquid. The up-flow tube provides circulation and establishes rapid surface flow velocities to prevent congealing of maskant liquid and the down-flow tube provides localized circulation and produces a fluid elevation change. A weir is provided at the top of each of the draft tubes, the use of which combined with the low speed impellers break up and disperse entrained air. The draft tubes include baffle plates suitably located to prevent the formation of vortices above, within and below the tubes. Adjustable fluid flow deflector plates are provided adjacent to the lower ends of the draft tubes to eliminate "dead spots" in the tank work zone. The tank is provided with rounded bottom portions at the opposite ends thereof to reduce turbulence and improve fluid flow in the lower regions of the tank. The tank design provides for containment, efficient agitation and circulation of water-base maskant fluid while preventing congealing thereof and minimizing mechanical energy transfer to the fluid.

14 Claims, 3 Drawing Sheets

TANK ARRANGEMENT PARTICULARLY DESIGNED FOR CHEMICAL MILLING OPERATIONS

BACKGROUND OF THE INVENTION

This invention relates to a novel tank arrangement, and is particularly directed to a tank for processing parts in chemical milling operations, containing a combination of features and elements for efficiently circulating the processing fluid, such as a water base maskant to be applied to parts prior to chemical milling thereof.

Particularly in the aircraft industry, chemical milling employing chemical etchants such as acids and bases are applied to structural components for shaping such components by subjecting them to a controlled deep etching. In such process, generally a maskant is first applied to the parts as a coating to protect the maskant covered areas of the parts from being etched when the parts are subjected to treatment in the etchant solution to etch preselected areas of the parts from which maskant has been removed.

A water base mask system has recently been developed by DeSoto Company of Des Plaines, Ill., which includes a precoat, maskant and topcoat. The liquid maskant material is a water base material in the form of a liquid latex type composition. Such maskant material has several major shortcomings. It retains air bubbles and congeals at the fluid-air-interface unless it is agitated, but excessive mechanical energy applied to the maskant material causes rapid degradation from a liquid latex type coating to a useless, hard latex rubber. Thus, the liquid maskant material is a shear sensitive material and if agitated too violently, it breaks down and forms undesirable particulate matter.

In an initial tank design to overcome the above shortcomings, use of a positive displacement pump, e.g. of the diaphragm type, produced insufficient fluid flow rates to promote adequate agitation of the maskant. The net result was entrained air bubbles, rapid maskant material degradation within the diaphragm pump, and undesirable settling of maskant solids.

Various fluid circulation and agitating devices have been developed in the prior art for use with various fluids. Thus U.S. Pat. No. 2,791,406 to Bates discloses agitating devices for a rectangular tank, employing agitators which discharge through elbows to provide directed flow. The device disclosed in the patent creates a high velocity stream across the fluid surface. If the patent device were employed for circulating water base maskant of the type noted above for use in chemical milling operations, eddy currents would tend to form along the walls, and would result in promoting mask skinning in low velocity areas.

U.S. Pat. No. 3,737,288 to Hochman discloses a draft tube-type reactor, utilizing a close clearance high speed agitator to draw materials into the tube. A semicircular flow deflector is mounted at the discharge end of the draft tube reactor, thereby directing the flow in a turbulent stream along the outer wall of the draft tube.

U.S. Pat. No. 4,278,460 to Chrisman, et al, discloses a method and apparatus for mixing molten glass employing spiral stirrers in draft tubes to blend and homogenize molten additives into a high viscosity host glass composition as it flows through a channel. The blending end homogenizing is performed by the rotating spiral stirrer operating within the draft tube, simultaneously mixing and pumping the molten mixture therethrough. A dam is positioned atop the draft tube or mixing block to stabilize the mixing block exit flow.

One object of the present invention is the design of a tank adapted to contain a liquid, particularly a water base maskant liquid for use in chemical milling operations, to provide high pumping rates for sufficient fluid flow and agitation to remove air bubbles and prevent congealing while minimizing mechanical energy transfer to the fluid.

Another object is the provision of a tank particularly designed for containment, agitation and circulation of chemical milling solutions, particularly a water base chemical milling maskant.

Other objects and advantages of the invention will appear hereinafter.

SUMMARY OF THE INVENTION

There is provided according to the invention a tank design or arrangement for containment, agitation and circulation of a liquid, particularly a shear sensitive liquid such as a water base chem-mill maskant for application of such maskant to parts which are to be chemically milled. Important features of the invention include up-flow and down-flow impellers enclosed in draft tubes mounted adjacent opposite ends of the tank. The up-flow tube provides circulation and establishes rapid surface flow velocities to prevent maskant from congealing at the fluid-air interface. The down-flow tube provides localized circulation and produces a fluid elevation change.

Means are positioned within each of the draft tubes to prevent the formation of vortices above, within and below the draft tubes. Such means are in the form of baffle plates strategically located within each of the draft tubes in relation to the impeller therein. A weir is mounted at the top of each of the draft tubes. Thus, fluid passing upwardly in the up-flow draft tube discharges from the top of such tube over the weir and flows across the upper portion of the tank and over the second weir and into the top of the second draft tube. The weirs combined with the low speed impellers break up and disperse entrained air and provide flow velocity over the entire fluid surface.

A transition member or sheet is mounted at the top of each of the draft tubes, with the weir on each of the draft tubes being positioned above the respective transition sheets. Thus, maskant fluid passing upwardly in the up-flow draft tube first flows onto the transition sheet and then over the weir on such draft tube, and fluid flowing across the tank passes over the weir at the top of the down-flow draft tube and onto the transition sheet thereon and then into the top of such draft tube.

Adjustable fluid flow deflector plates are also provided adjacent the lower end of each of the draft tubes, with means included for adjusting the angular position of each of the deflector plates. Such adjustable flow deflector plates eliminate "dead spots" in the tank work zone.

In addition, the tank is provided with rounded or radiused bottom portions at the ends of the tank to reduce turbulence and improve fluid flow in the lower regions of the tank.

Since as previously noted, the aqueous maskant composition contained in the tank is a shear sensitive material, the overall design of the tank for treating parts therein with such maskant material is based on obtaining optimum circulation of the maskant material with minimum shear thereof.

The invention will be described in greater detail below, taken in conjunction with the accompanying drawings.

DETAILED DESCRIPTION OF THE INVENTION AND PREFERRED EMBODIMENTS

Figure 1:
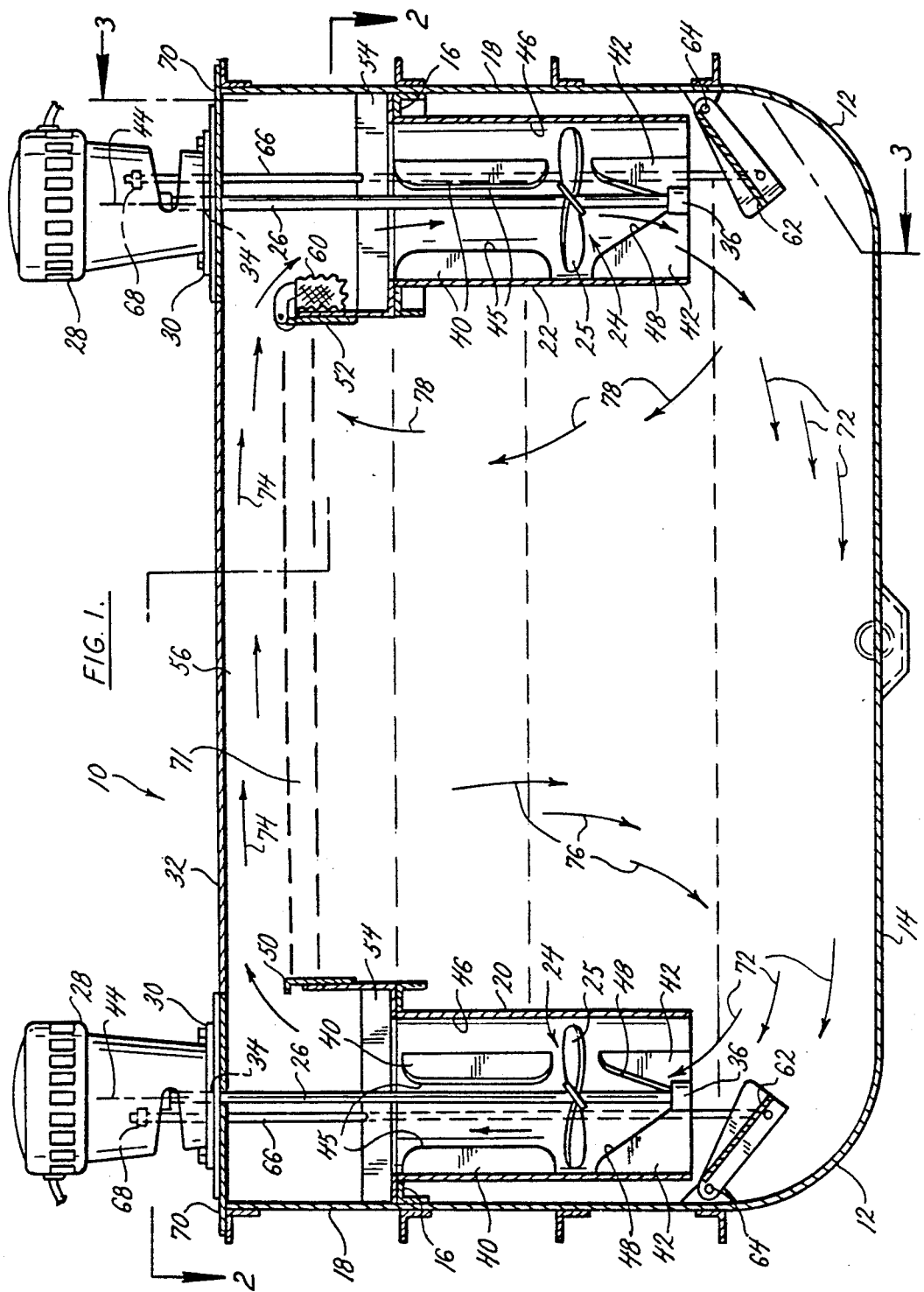
FIG. 1 is an elevational cross-section of the tank arrangement of the invention, particularly for circulation of water-base maskant for chem-milling processing.
Figure 2:
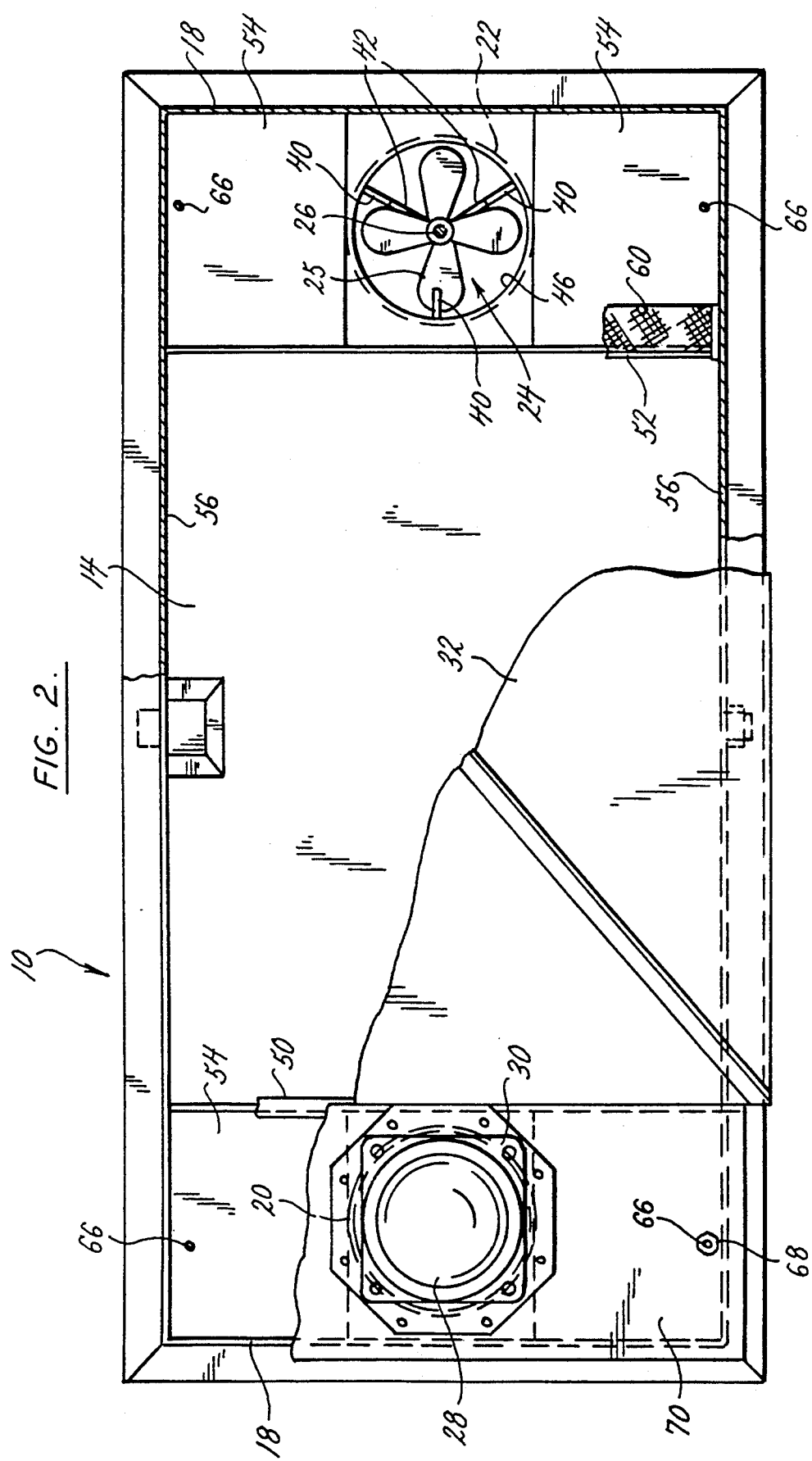
FIG. 2 is a horizontal section taken on line 2—2 of FIG. 1, partially broken away.

Referring to the drawings, numeral 10 is a tank for circulation of water-base maskant, the tank being provided with rounded end portions 12 at opposite ends of the tank bottom 14. Mounted on support brackets 16 adjacent opposite ends 18 of the tank is a first draft tube 20 and a second like draft tube 22. The draft tubes 20 and 22 are each spaced from the top and bottom of the tank so as to provide adequate circulation of fluid in the tank to and from the bottom and top of each draft tube.

Enclosed in each of the draft tubes 20 and 22 is an impeller 24 comprising an agitator or propeller 25 mounted on a central drive shaft 26 which depends from a motor 28 mounted on a plate 30 on the top 32 of the tank adjacent opposite ends thereof. The drive shaft 26 extends through a bearing or aperture 34 in plate 30 and into a lower central bearing 36 supported by a plurality of vertical baffles 42 at the lower end of the draft tube. In the present embodiment the draft tube 20 is the up-flow tube and the draft tube 22 is the down-flow tube. Accordingly, the propeller 25 in draft tube 20 is rotated clockwise to pump fluid upwardly through the draft tube, and the propeller 25 of draft tube 22 is rotated counter-clockwise to pump the fluid downward through such draft tube.

A first series of vertical baffles 40 is provided in each of the draft tubes 20 and 22, such baffles being located above the propeller 25, and a second series of vertical baffles 42 is provided in each of the draft tubes and located below the propeller 25 therein. The baffles 40 and 42 are mounted on the inner sidewall 46 of each of the draft tubes. The first series of baffles 40 comprises three such baffles disposed radially and spaced equidistantly about the central axis 44 of each draft tube. Baffles 40 extend radially inward from the sidewall 46 of the draft tubes a distance of less than half the radius of the draft tubes, and have a straight inner vertical edge 45. The second series of baffles 42 positioned below the propeller 25 in each of the draft tubes is also composed of three baffles 42 also disposed radially and equidistantly about the central axis 44 of each draft tube, the respective upper and lower baffles 40 and 42 being in a substantially vertical plane and in vertical alignment. The lower baffles 42 are of different shape from the upper baffles 40, and have inclined sides 48 extending from their outer upper ends down to the central bearing 36 of the drive shaft 26.

Figure 3:
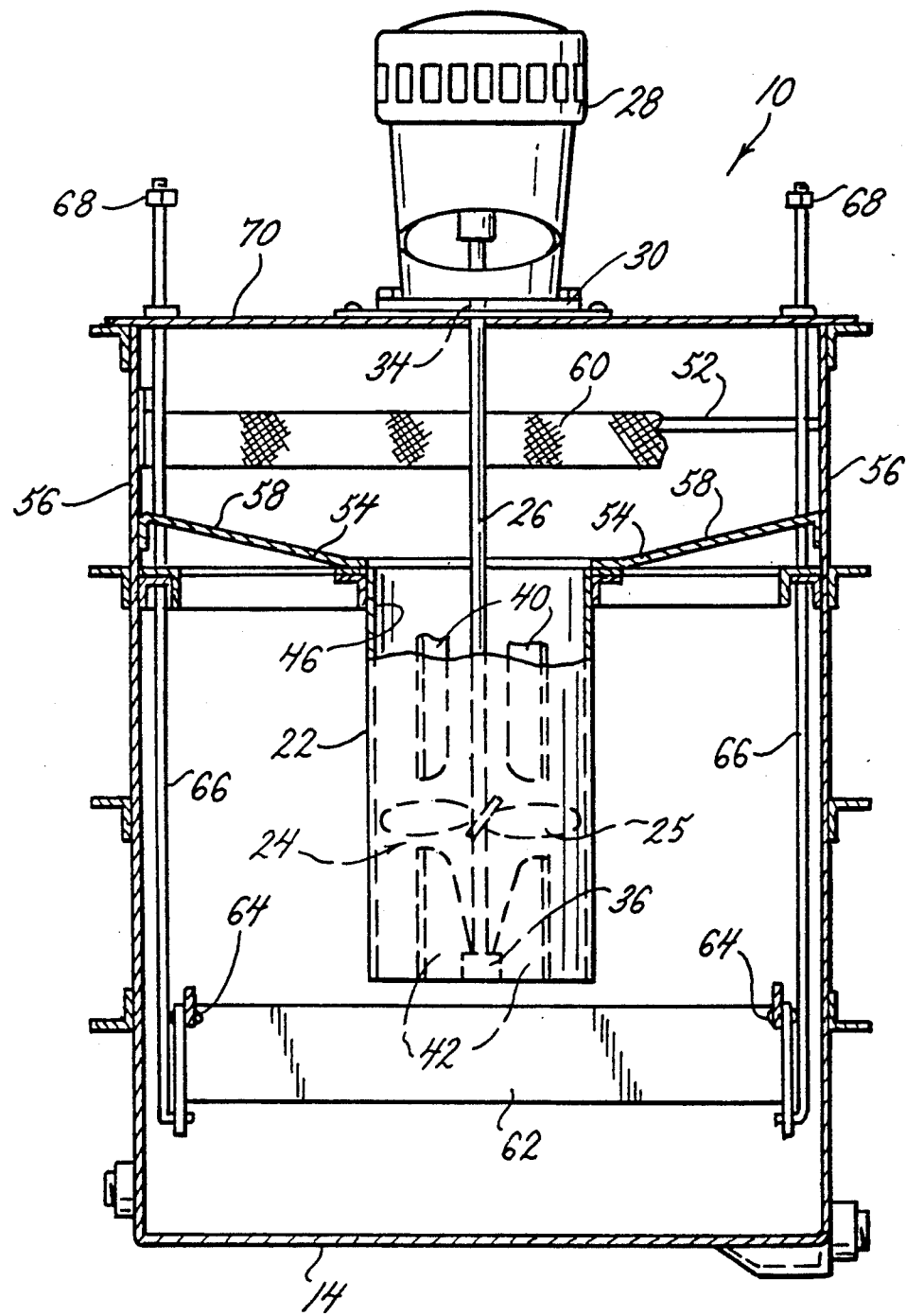
FIG. 3 is a sectional end view taken on line 3—3 of FIG. 1.

A weir 50 is mounted on the bracket 16 at the top of draft tube 20, the weir 50 being positioned on the side of draft tube 20 closest to the central portion of tank 10. Similarly, a weir 52 is mounted on bracket 16 at the top of the second draft tube 22, such weir also being positioned on the side of draft tube 22 closest to the central portion of the tank 10. The weirs 50 and 52 extend across the tank from and are connected to the opposite sides 56 of the tank, as seen in FIG. 3. A transition piece or metal sheet 54 is mounted at the top of draft tube 20 below the weir 50, such metal sheet being connected to the opposite sides 56 of the tank and inclined downwardly, as shown at 58, from its outer ends to the outer periphery of the draft tube around the top thereof. A similar transition piece or sheet 54 is provided above the draft tube 22 and below the weir 52 thereof, extending across the tank from side to side thereof. The transition sheet 54 at the top of each of the draft tubes 20 and 22 serves as a passageway for water base maskant discharge from the up-flow draft tube 20 over transition sheet 54 thereon, and passing over weir 50, and for passage of liquid discharged over weir 52 on draft tube 22, onto the transition sheet 54 and then into the down-flow draft tube 22.

It is seen that the transition piece 54 at the top of each of the draft tubes permits the fluid to pass from a smaller area at the top of the draft tube 20 to a wide area for passage over weir 50, and vice versa, as seen particularly in FIG. 3, for passage of maskant liquid over the weir 52 into the wide area of the transition sheet 54 and then into a smaller area provided at the top of the draft tube 22. Thus, the transition sheet 54 at the top of each of the draft tubes 20 and 22 funnels fluid out of the up-flow draft tube 20 and into the down-flow draft tube 22, and in conjunction with the respective weirs 50 and 52, uniform flow of maskant liquid is provided without skinning and with minimal formation of solid material. A filter screen 60 is mounted on the inside surface of the weir 52 positioned over the draft tube 22, so that any particulate matter in the liquid flowing over weir 52 and into the draft tube 22 is deposited in the screen.

A deflector plate 62 is mounted at the bottom of each of the draft tubes 20 and 22. Each of the deflector plates 62 is mounted for angular movement on a pivot 64 positioned on the respective ends 18 of the tank. The deflector plates are each mounted for angular adjustment by means of a threaded rod 66 mounted on tank bracket 70, which can be pulled upward or lowered by means of one or more jam nuts 68. Such deflector plates aid in eliminating "dead spots" in the tank and permit adjustment of passage of the fluid along the bottom of the tank or deflection of the fluid more to the center of the tank or coating zone, as desired.

In operation, the primary circulation of liquid 71 in the tank is across the bottom of the tank from the bottom of the down-flow draft tube 22 to the bottom of the up-flow draft tube 20, as indicated by the arrows 72 in FIG. 1, and across the top of the tank from the top of the up-flow draft tube 20 to the top of the down-flow draft tube 22, as indicated by the arrows 74. The fluid is pumped upwardly by impeller 24 in draft tube 20 over the transition sheet 54 thereon and over the weir 50, and the discharged fluid then traverses the length of the tank along the upper portion thereof and over the weir 52 and transition sheet 54 at the top of draft tube 22 and is then pumped downwardly through draft tube 22 by the impeller 24 therein.

When the liquid is discharged from the top of draft tube 20, a certain minor volume of the fluid effectively short circuits into the bottom of draft tube 20, as indicated by the arrows 76, and a minor volume of the fluid discharged from the bottom of draft tube 22 effectively short circuits over the top of weir 52 and into the top of draft tube 22, as indicated by the arrows 78. However, the majority of the circulating fluid circulates into the middle of the tank. In the center of the tank, the circulation is very mild whereas around the draft tubes it is rather rapid.

The impellers 24 employed in the invention system are low speed, high volumetric displacement impellers which are employed to aid in minimizing shear stresses imparted on water base maskant liquid. The use of an overflow weir 50 and an underflow weir 52 which extend from one side 56 to the opposite side 56 of the tank, with transitional sheet metal passageways formed by the transition sheets 54 which also extend from side 56 to the opposite side 56 of the tank, and extending down to the respective draft tubes, and the use of flow deflectors as at 62, combined with the radiused tank sides, imparts a uniform, uni-directional flow across the tank. The use of weirs also promotes bubble breaking capability.

Although the tank design according to the invention is particularly applicable for circulation of water-base maskant for treatment of parts to be subjected to chemical milling, the specialized agitation--pumping technology of the present application can also be applied in other applications, e.g. in agitation and circulation of specialized chemical milling solutions, or other water based maskant formulations.

From the foregoing, it is seen that the invention provides a novel tank arrangement for uniform circulation of fluid, particularly water-base maskant liquid for chemical milling operations, utilizing low speed, high volumetric displacement impellers and specialized draft tube construction including a baffle arrangement therein, and other features including a system of weirs and deflector plates. The invention device is designed to provide for containment, efficient agitation and circulation particularly of water-base chem-mill maskant liquid, and removing air bubbles, and preventing congealing while minimizing mechanical energy transfer to the fluid.

Since various changes and modifications of the invention will occur to those skilled in the art within the spirit of the invention, the invention is not to be taken as limited except by the scope of the appended claims.

What is claimed is:

1. A tank arrangement particularly adapted for processing parts in chemical milling operations, which comprises
    a tank adapted to contain a fluid for treatment of parts for chemical milling thereof,
    a first draft tube mounted adjacent one end of said tank,
    a second draft tube mounted adjacent the other end of said tank,
    a first impeller enclosed within said first draft tube, and arranged to produce upward flow of fluid entering said first draft tube from said tank,
    a second impeller enclosed within said second draft tube, and arranged to produce downward flow of fluid entering said second draft tube from said tank, and
    means positioned within each of said draft tubes to prevent the formation of vortices above, within and below said draft tubes.

2. The tank arrangement of claim 1, each said draft tube being spaced from the bottom and the top of said tank to permit fluid flow from the bottom portion of said tank into said first draft tube and to permit fluid flow from the upper portion of said tank into said second draft tube, thereby establishing fluid flow across the bottom and upper portions of said tank between said draft tubes.

3. The tank arrangement of claim 1, each of said impellers including a propeller mounted for rotation on the central axis of each draft tube, said propeller being mounted intermediate the opposite ends of the draft tube, and means for driving each of said propellers.

4. The tank arrangement of claim 1, said means to prevent the formation of vortices comprising baffle means mounted within each of said draft tubes.

5. The tank arrangement of claim 3, said means to prevent the formation of vortices including a first series of baffles mounted above said propeller in each of said draft tubes, and a second series of baffles mounted below said propeller in each of said draft tubes.

6. The tank arrangement of claim 5, each of said series of baffles consisting of a plurality of baffles disposed radially about the central axis of each draft tube, said baffles mounted on the inner wall of each draft tube and positioned in a substantially vertical plane.

7. The tank arrangement of claim 1, and including a first weir mounted at the top of said first draft tube and a second weir mounted at the top of said second draft tube, the fluid passing upwardly in said first draft tube discharging from the top of said draft tube and said first weir, and flowing across the upper portion of said tank and over said second weir and into the top of said second draft tube.

8. The tank arrangement of claim 7, including a transition member mounted at the top of each of said draft tubes and extending from the outer periphery of each draft tube to the opposite sides of the tank, the weir on each of the draft tubes positioned above the respective transition members, said transition members being inclined downwardly from the opposite sides of said tank to the outer periphery around each draft tube, whereby fluid passing upwardly in said first draft tube flows onto one of said transition members and then over said first weir, and fluid flowing over said second weir flows into the other transition member and then into the top of said second draft tube.

9. The tank arrangement of claim 1, including a first fluid flow deflector plate mounted adjacent the lower end of said first draft tube and a second fluid flow deflector plate mounted adjacent the lower end of said second draft tube.

10. The tank arrangement of claim 9, and including means for adjusting the angular position of each of said deflector plates.

11. The tank arrangement of claim 1, said tank having a round bottom portion at each end of the tank.

12. A tank arrangement particularly adapted for processing parts in chemical milling operations, which comprises
    a tank adapted to contain a fluid for treatment of parts for chemical milling thereof,
    a first draft tube mounted adjacent one end of said tank,
    a second draft tube mounted adjacent the other end of said tank,
    each said draft tube being spaced from the bottom and the top of said tank to permit fluid flow from the bottom portion of said tank into said first draft tube and to permit fluid flow from the upper portion of said tank into said second draft tube, thereby establishing fluid flow across the bottom and upper portions of said tank between said draft tubes, a first low speed high volumetric displacement impeller enclosed within said first draft tube and arranged to produce upward flow of fluid entering said first draft tube from said tank, a second low speed high volumetric displacement impeller enclosed within said second draft tube, and arranged to produce downward flow of fluid entering said second draft tube from said tank, each of said impellers including a propeller mounted for rotation on the central axis of each draft tube, said propeller being mounted intermediate the opposite ends of the draft tube, and means for driving each of said propellers, means positioned within each of said draft tubes to prevent the formation of vortices above, within and below said draft tubes, said last mentioned means including a first series of baffles mounted above said propeller in each of said draft tubes, and a second series of baffles mounted below said propeller in each of said draft tubes, each of said series of baffles consisting of a plurality of baffles disposed radially and spaced equidistantly about the central axis of each draft tube, said baffles mounted on the inner wall of each draft tube and positioned in a substantially vertical plane, a first weir mounted at the top of said first draft tube, and a second weir mounted at the top of said second draft tube, the fluid passing upwardly in said first draft tube discharging from the top of said draft tube and said first weir, and flowing across the upper portion of said tank and over said second weir and into the top of said second draft tube.

13. The tank arrangement of claim 12, including a transition sheet mounted at the top of each of said draft tubes and extending from the outer periphery of each draft tube to the opposite sides of the tank, the weir on each of the draft tubes positioned above the respective transition sheets, said transition sheets being inclined downwardly from the opposite sides of said tank to the outer periphery around each draft tube, whereby fluid passing upwardly in said first draft tube flows onto one of said transition sheets and then over said first weir, and fluid flowing over said second weir flows onto the other transition sheet and then into the top of said second draft tube, a first fluid flow deflector plate mounted adjacent the lower end of said first draft tube and a second fluid flow deflector plate mounted adjacent the lower end of said second draft tube, and means for adjusting the angular position of each of said deflector plates.

14. The tank arrangement of claim 12, including a like number of baffles in each of said series of baffles, the respective baffles of each series being in vertical alignment, the baffles of said second series of baffles having a different shape than the baffles of said first series of baffles.

* * * * *